United States Patent
Kim et al.

(10) Patent No.: US 9,606,438 B2
(45) Date of Patent: Mar. 28, 2017

(54) RESIST UNDERLAYER COMPOSITION, METHOD OF FORMING PATTERNS, AND SEMICONDUCTOR INTEGRATED CIRCUIT DEVICE INCLUDING THE PATTERN

(71) Applicant: CHEIL INDUSTRIES INC., Gumi-si, Gyeongsangbuk-do (KR)

(72) Inventors: Min-Gyum Kim, Suwon-si (KR); Hyo-Young Kwon, Suwon-si (KR); Jun-Ho Lee, Suwon-si (KR); Hwan-Sung Cheon, Suwon-si (KR)

(73) Assignee: CHEIL INDUSTRIES, INC., Gumi-Si, Gyeongsangbuk-Do (KR)

( * ) Notice: Subject to any disclaimer, the term of this patent is extended or adjusted under 35 U.S.C. 154(b) by 0 days.

(21) Appl. No.: 14/782,539

(22) PCT Filed: Nov. 5, 2013

(86) PCT No.: PCT/KR2013/009957
§ 371 (c)(1),
(2) Date: Oct. 5, 2015

(87) PCT Pub. No.: WO2014/189185
PCT Pub. Date: Nov. 27, 2014

(65) Prior Publication Data
US 2016/0041470 A1  Feb. 11, 2016

(30) Foreign Application Priority Data
May 21, 2013  (KR) .................. 10-2013-0057256

(51) Int. Cl.
| | |
|---|---|
| G03F 7/11 | (2006.01) |
| G03F 7/36 | (2006.01) |
| G03F 7/30 | (2006.01) |
| G03F 7/32 | (2006.01) |
| G03F 7/40 | (2006.01) |
| G03F 7/20 | (2006.01) |
| G03F 7/09 | (2006.01) |

(52) U.S. Cl.
CPC ............... *G03F 7/11* (2013.01); *G03F 7/091* (2013.01); *G03F 7/094* (2013.01); *G03F 7/20* (2013.01); *G03F 7/30* (2013.01); *G03F 7/32* (2013.01); *G03F 7/36* (2013.01); *G03F 7/40* (2013.01)

(58) Field of Classification Search
None
See application file for complete search history.

(56) References Cited

U.S. PATENT DOCUMENTS

| | | | |
|---|---|---|---|
| 6,287,975 B1 | 9/2001 | DeOrnellas et al. | |
| 2006/0222999 A1 | 10/2006 | Miyazaki et al. | |
| 2007/0148586 A1* | 6/2007 | Uh ........................ | G03F 7/0752 430/270.1 |
| 2010/0234485 A1* | 9/2010 | Kohli Steck ......... | C08G 18/222 522/174 |
| 2011/0027717 A1 | 2/2011 | Tsutsumi et al. | |
| 2011/0155944 A1 | 6/2011 | Cho et al. | |
| 2012/0183676 A1 | 7/2012 | Sonoda et al. | |

FOREIGN PATENT DOCUMENTS

| | | |
|---|---|---|
| JP | 2002-372778 A | 12/2002 |
| JP | 2005-173552 A | 6/2005 |
| JP | 4793583 B2 | 10/2011 |
| KR | 10-2007-0073613 A | 7/2007 |
| KR | 10-0816735 B1 | 3/2008 |
| KR | 10-2008-0062963 A | 7/2008 |
| KR | 10-2008-0081584 A | 9/2008 |
| KR | 10-0888613 B1 | 3/2009 |
| KR | 10-2010-0072660 A | 7/2010 |
| KR | 10-2011-0079201 A | 7/2011 |
| KR | 10-1067828 B1 | 9/2011 |
| KR | 10-2001-0098743 A | 11/2011 |
| KR | 10-2012-0073101 A | 7/2012 |
| KR | 10-2013-0020577 A | 2/2013 |
| KR | 10-1257694 B1 | 4/2013 |
| TW | 200513472 A | 4/2005 |
| TW | 201134799 A | 10/2011 |

OTHER PUBLICATIONS

Search Report dated Jun. 9, 2015 in corresponding Taiwanese Patent Application No. 102141368.

* cited by examiner

*Primary Examiner* — Sin Lee
(74) *Attorney, Agent, or Firm* — Lee & Morse, P.C.

(57) ABSTRACT

Disclosed is a resist underlayer composition including a compound including a moiety represented by the following Chemical Formula 1 and a solvent.

[Chemical Formula 1]

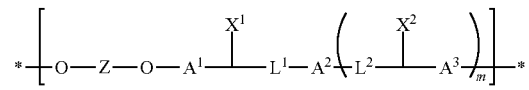

In the above Chemical Formula 1, $A^1$ to $A^3$, $X^1$, $X^2$, $L^1$, $L^2$, Z, and m are the same as defined in the specification.

18 Claims, No Drawings

RESIST UNDERLAYER COMPOSITION, METHOD OF FORMING PATTERNS, AND SEMICONDUCTOR INTEGRATED CIRCUIT DEVICE INCLUDING THE PATTERN

CROSS REFERENCE TO RELATED APPLICATIONS

This is the U.S national phase application based on PCT Application No. PCT/KR2013/009957, filed Nov. 5, 2013, which is based on Korean Patent Application No. 10-2013-0057256, filed May 21, 2013, the entire contents of all of which are hereby incorporated by reference.

TECHNICAL FIELD

A resist underlayer composition, a method of forming patterns using the same, and a semiconductor integrated circuit device including the patterns are disclosed.

BACKGROUND ART

Recently, the semiconductor industry has developed an ultra-fine technique having a pattern of several to several tens of nanometers in size. Such ultrafine technique essentially needs effective lithographic techniques.

The typical lithographic technique includes providing a material layer on a semiconductor substrate; coating a photoresist layer thereon; exposing and developing the same to provide a photoresist pattern; and etching the material layer using the photoresist pattern as a mask.

Nowadays, when small-sizing the pattern to be formed, it is difficult to provide a fine pattern having an excellent profile by only the above-mentioned typical lithographic technique. Accordingly, a layer, called a hardmask layer or a resist underlayer, may be formed between the material layer to be etched and the photoresist layer to provide a fine pattern.

On the other hand, it has been recently suggested to form a resist underlayer by a spin-on coating method instead of chemical vapor deposition. The resist underlayer plays the role of an intermediate layer for transferring the fine pattern of photoresist to the material layer through a selective etching process. Accordingly, the resist underlayer is required to have chemical resistance, heat resistance and etch resistance and the like during the multiple etching processes.

DISCLOSURE

Technical Problem

One embodiment provides a resist underlayer composition being capable of improving optical properties, etch resistance, and chemical resistance.

Another embodiment provides a method of forming patterns using the hardmask composition.

Yet another embodiment provides a semiconductor integrated circuit device including patterns formed using the method.

Technical Solution

According to one embodiment, a resist underlayer composition including a compound including a moiety represented by the following Chemical Formula 1 and a solvent is provided.

[Chemical Formula 1]

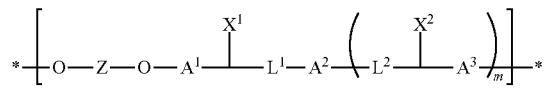

In the above Chemical Formula 1, $A^1$ to $A^3$ are each independently an aliphatic cyclic group or an aromatic ring group, $X^1$ and $X^2$ are each independently hydrogen, a hydroxy group, a thionyl group, a thiol group, a cyano group, a substituted or unsubstituted amino group, a halogen, a halogen-containing group, or a combination thereof, $L^1$ and $L^2$ are each independently a single bond or a substituted or unsubstituted C1 to C6 alkylene group, and Z is a metal-containing group represented by the following Chemical Formula 2, and m is 0 or 1.

$$M(R^1)_a(R^2)_b(R^3)_c(R^4)_d \qquad \text{[Chemical Formula 2]}$$

In the above Chemical Formula 2,

M is a metal, $R^1$, $R^2$, $R^3$ and $R^4$ are each independently one of hydrogen, a hydroxy group, a substituted or unsubstituted C1 to C10 alkyl group, a substituted or unsubstituted C6 to C10 aryl group, an allyl group, a halogen atom, a substituted or unsubstituted amino group, and a substituted or unsubstituted C1 to C10 alkoxy group, and a, b, c, and d are each independently 0 or 1.

The metal may be Sc, Ti, V, Cr, Mn, Fe, Co, Ni, Cu, Zn, Zr, Mo, Ag, Cd, Pt, Au, Hf, Rf, or Rg.

The $A^1$ to $A^3$ may be each independently a substituted or unsubstituted cyclic group selected from the following Group 1.

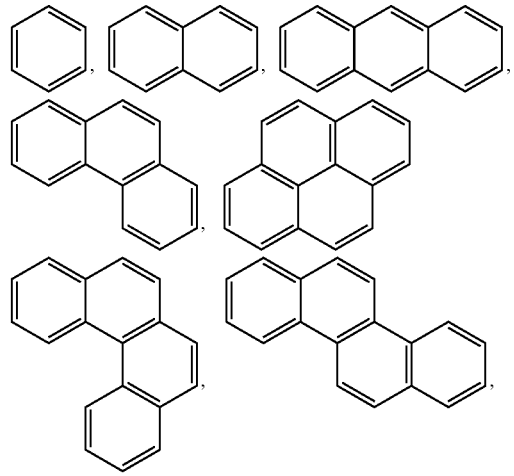

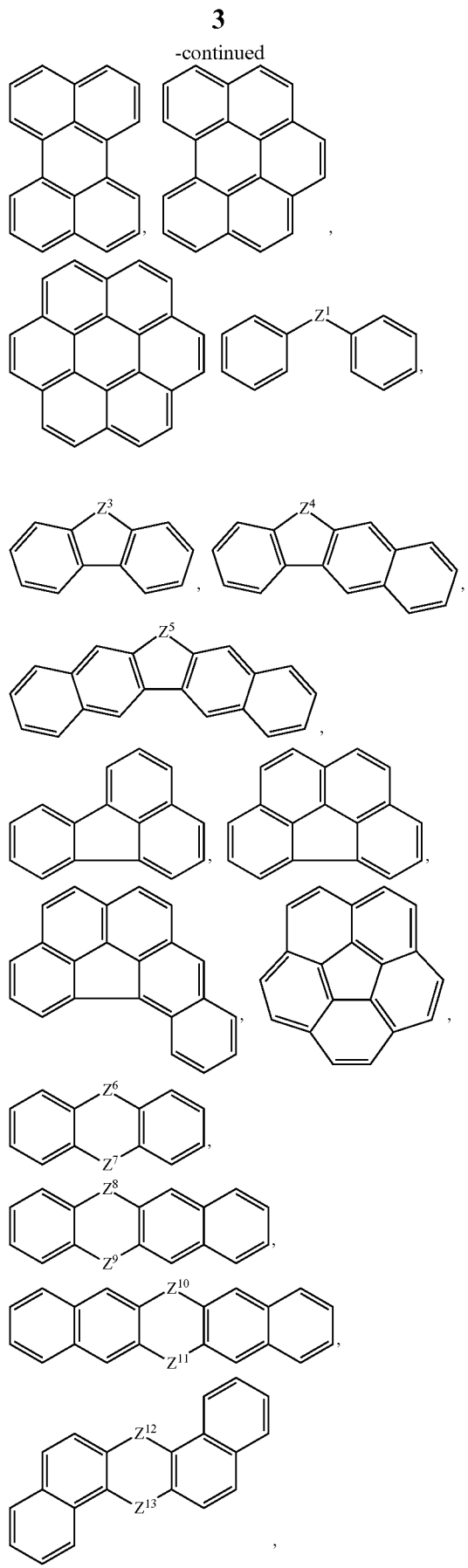

In Group 1,

Z$^1$ and Z$^2$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, NR$^a$, oxygen (O), sulfur (S), or a combination thereof, wherein R$^a$ is hydrogen, a substituted or unsubstituted C1 to C10 alkyl group, a halogen atom, or a combination thereof, and Z$^3$ to Z$^{17}$ are each independently C=O, NW, oxygen (O), sulfur (S), CR$^b$R$^c$, or a combination thereof, wherein R$^a$ to R$^c$ are each independently hydrogen, a substituted or unsubstituted C1 to C10 alkyl group, a halogen atom, a halogen-containing group, or a combination thereof.

At least one of the A$^1$ to A$^3$ may be a polycyclic aromatic group.

The A$^1$ and A$^3$ may be each independently a benzene group, a naphthalene group, or a biphenyl group, and the A$^2$ may be a pyrene group, a perylene group, a benzoperylene group, or a coronene group.

The compound may include a moiety represented by the following Chemical Formula 3.

[Chemical Formula 3]

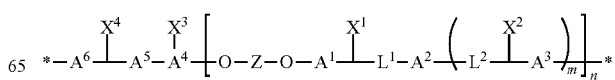

In the above Chemical Formula 3, $A^1$ to $A^6$ are each independently an aliphatic cyclic group or an aromatic ring group, $X^1$ to $X^4$ are each independently hydrogen, a hydroxy group, a thionyl group, a thiol group, a cyano group, a substituted or unsubstituted amino group, a halogen atom, a halogen-containing group, or a combination thereof, $L^1$ and $L^2$ are each independently a single bond or a substituted or unsubstituted C1 to C6 alkylene group, Z is a metal-containing group represented by the above Chemical Formula 2, m is 0 or 1, and n is an integer of 1 to 15.

In the above Chemical Formula 3, the $A^1$ to $A^6$ may be each independently a substituted or unsubstituted cyclic group selected from Group 1.

In the above Chemical Formula 3, the $A^1$, $A^3$, $A^4$, and $A^6$ may be each independently a benzene group, a naphthalene group, or a biphenyl group, and the $A^2$ and $A^5$ are each independently a pyrene group, a perylene group, a benzoperylene group, or a coronene group.

The compound may be represented by the following Chemical Formula 4.

[Chemical Formula 4]

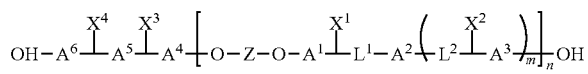

The compound may be represented by the following Chemical Formula 5.

[Chemical Formula 5]

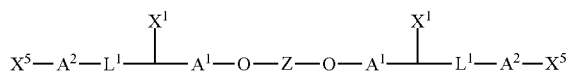

In the above Chemical Formula 5, $X^1$ and $X^5$ are each independently hydrogen, a hydroxy group, a thionyl group, a thiol group, a cyano group, a substituted or unsubstituted amino group, a halogen atom, a halogen-containing group, or a combination thereof.

The compound may be included in an amount of 0.01 wt % to 50 wt % based on 100 wt % of the solvent.

The solvent may include at least one selected from propylene glycol monomethyl ether acetate (PGMEA), propylene glycol monomethylether (PGME), cyclohexanone, and ethyl lactate.

According to another embodiment, a method of forming patterns includes providing a material layer on a substrate, applying the resist underlayer composition on the material layer, heat-treating the resist underlayer composition to form a resist underlayer, forming a photoresist layer on the resist underlayer, exposing and developing the photoresist layer to form a photoresist pattern, selectively removing the resist underlayer using the photoresist pattern to expose a part of the material layer, and etching an exposed part of the material layer.

The resist underlayer may be formed using a spin-on-coating method.

The resist underlayer composition may be heat-treated at 150° C. to 500° C.

Before forming the resist underlayer, a bottom anti-reflective coating (BARC) may be further formed.

According to yet another embodiment, a semiconductor integrated circuit device including a plurality of patterns manufactured according to the method is provided.

Advantageous Effects

According to one embodiment, etch resistance and chemical resistance as well as optical properties may be improved.

BEST MODE

Hereinafter, exemplary embodiments of the present invention will be described in detail so that a person skilled in the art would understand. However, this disclosure may, however, be embodied in many different forms and is not construed as limited to the exemplary embodiments set forth herein.

In the present specification, when a definition is not otherwise provided, the term 'substituted' refers to one substituted with at least a substituent selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

In the present specification, when a definition is not otherwise provided, 'hetero' refers to one including 1 to 3 heteroatoms selected from N, O, S, and P.

Hereinafter, a resist underlayer composition according to one embodiment is described.

A resist underlayer composition according to one embodiment includes a compound including a moiety represented by the following Chemical Formula 1 and a solvent.

[Chemical Formula 1]

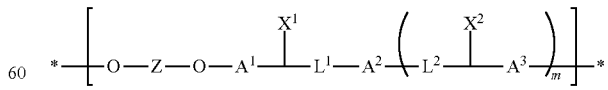

In the above Chemical Formula 1, $A^1$ to $A^3$ are each independently an aliphatic cyclic group or an aromatic ring group, $X^1$ and $X^2$ are each independently hydrogen, a hydroxy group, a thionyl group, a thiol group, a cyano group, a substituted or unsubstituted amino group, a halogen atom, a halogen-containing group, or a combination thereof, $L^1$ and $L^2$ are each independently a single bond or a substituted or unsubstituted C1 to C6 alkylene group, Z is a metal-containing group, and m is 0 or 1.

In the above Chemical Formula 1, the * indicates a point where a moiety is linked in the compound.

The moiety represented by the above Chemical Formula 1 includes at least two aliphatic cyclic groups or aromatic ring groups, and a plurality of functional groups ($X^1$ and $X^2$) are positioned between these aliphatic cyclic groups or aromatic ring groups. The structure has excellent solubility and its properties may be easily controlled by a substituent. Particularly, the pluralities of functional groups ($X^1$ and $X^2$) improve solubility and thus effectively form a thin layer using a spin-on coating method. When the thin layer is spin-on coated on a lower layer having a predetermined pattern, gap-filling among the patterns and planarization characteristics may be improved.

Amplified cross-linking reactions are performed due to a condensation reaction with the plurality of functional groups, and thereby excellent cross-linking characteristics may be realized. Accordingly, the moiety represented by the above Chemical Formula 1 is heat-treated at a relatively low temperature, the moiety is cross-linked to form a high molecular weight polymer for a short time and thus, characteristics required in a resist underlayer such as mechanical characteristics, heat resistance, and etch resistance may be realized.

At least one of the $A^1$ to $A^3$ indicating an aliphatic cyclic group or an aromatic ring may be substituted with a hydroxy group, instead of at least one hydrogen.

The moiety represented by the above Chemical Formula 1 includes a metal-containing group. Both ends of the metal-containing group are linked to oxygen, respectively, and one oxygen is linked to a moiety including an aliphatic cyclic group or aromatic ring group.

In the above Chemical Formula 1, Z indicating the metal-containing group is represented by the following Chemical Formula 2.

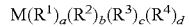 [Chemical Formula 2]

In the above Chemical Formula 2,

M is a metal, $R^1$, $R^2$, $R^3$, and $R^4$ are each independently hydrogen, a hydroxy group, a substituted or unsubstituted C1 to C10 alkyl group, a substituted or unsubstituted C6 to C10 aryl group, an allyl group, a halogen atom, a substituted or unsubstituted amino group, and a substituted or unsubstituted C1 to C10 alkoxy group, and a, b, c and d are each independently 0 or 1.

In the above Chemical Formula 2, the metal represented by M may be any metal of the periodic table satisfying the above Chemical Formula 2.

For example the metal may have a valence electron number of 2 to 6.

When the a, b, c, and d are 0, the metal may be, for example Be, Mg, Ca, Cr, Sr, Ba, or Ra.

In the above Chemical Formula 2, the metal represented by M may be a transition metal. The metal may be, for example Sc, Ti, V, Cr, Mn, Fe, Co, Ni, Cu, Zn, Zr, Mo, Ag, Cd, Pt, Au, Hf, Rf, or Rg, but is not limited thereto.

For example, the a and b are 0, and c and d are 1, and the metal may be Ti. Herein, the $R^3$ and $R^4$ may be each independently one of hydrogen, a hydroxy group, a substituted or unsubstituted C1 to C10 alkyl group, a substituted or unsubstituted C6 to C10 aryl group, an allyl group, a halogen atom, a substituted or unsubstituted amino group, and a substituted or unsubstituted C1 to C10 alkoxy group. For example the $R^3$ and $R^4$ may be each independently a C1 to C10 alkoxy group where at least one hydrogen is substituted with a metal.

The moiety represented by the above Chemical Formula 1 has a structure including a metal, and thus the compound decreases reactivity for etch gases. Accordingly, etch resistance increases, and the resist underlayer composition has good etch resistance.

The $A^1$ to $A^3$ may be each independently a substituted or unsubstituted cyclic group selected from Group 1.

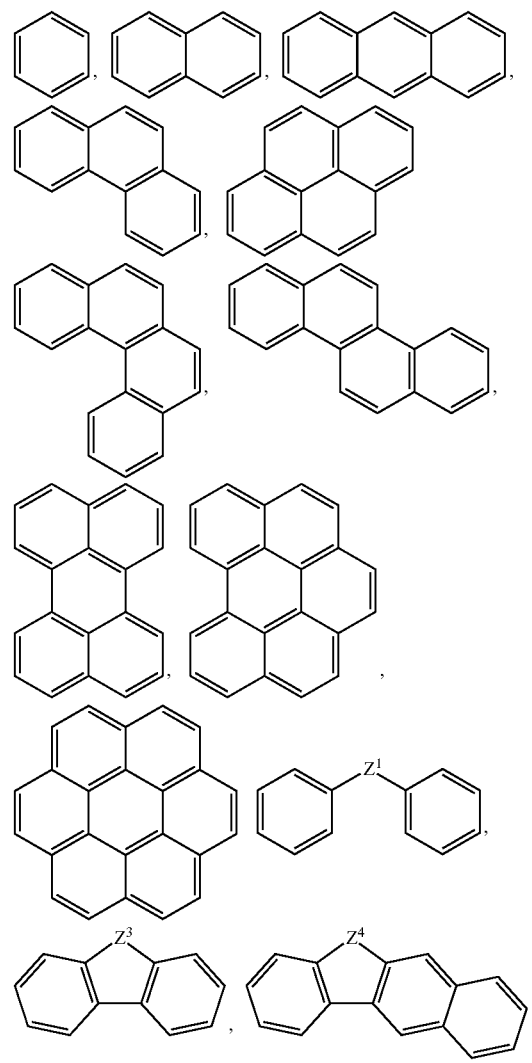

[Group 1]

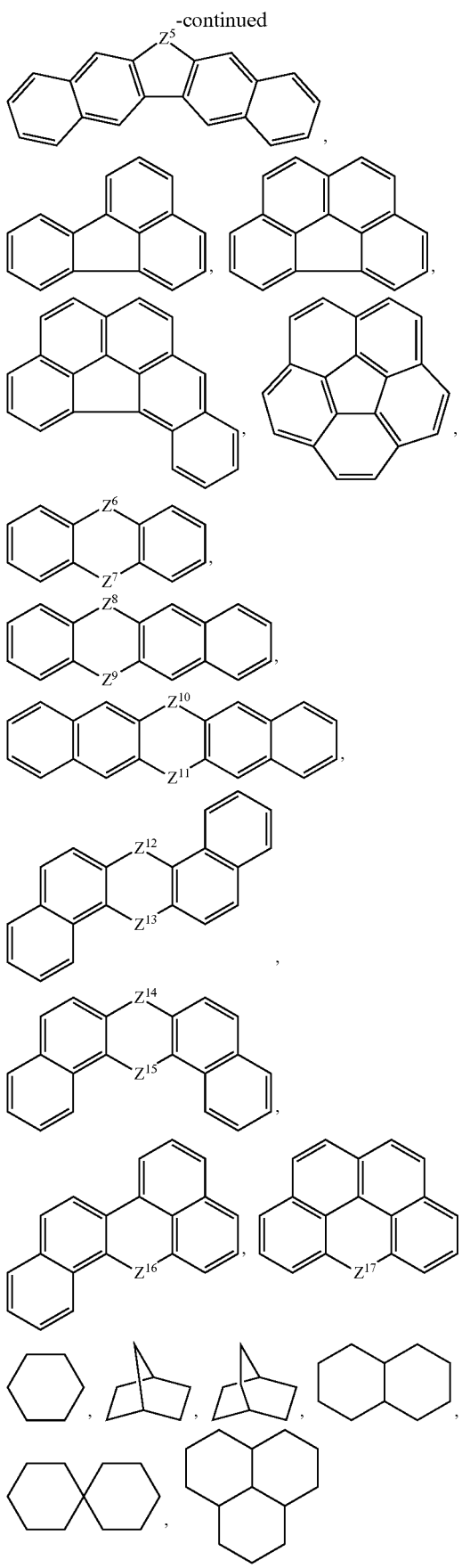

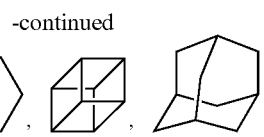

In Group 1,

Z¹ and Z² are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, NR$^a$, oxygen (O), sulfur (S), or a combination thereof, wherein R$^a$ is hydrogen, a substituted or unsubstituted C1 to C10 alkyl group, a halogen atom, or a combination thereof, Z³ to Z¹⁷ are each independently C=O, NR$^a$, oxygen (O), sulfur (S), CR$^b$R$^c$, or a combination thereof, wherein R$^a$ to R$^c$ are each independently hydrogen, a substituted or unsubstituted C1 to C10 alkyl group, a halogen atom, a halogen-containing group, or a combination thereof.

In Group 1, linking positions of each ring are not particularly limited, and each ring may be substituted or unsubstituted. When the ring listed in Group 1 is a substituted ring, it may be for example substituted with a C1 to C20 alkyl group, a halogen, a hydroxy group, and the like, without limitation.

A¹ to A³ may be, for example, a substituted or unsubstituted aromatic group, for example a benzene group, a naphthalene group, a biphenyl group, a pyrene group, a perylene group, a benzoperylene group, a coronene group, or a combination thereof.

At least one of A¹ to A³ may be a polycyclic aromatic group, for example a pyrene group, a perylene group, a benzoperylene group, a coronene group, or a combination thereof.

For example, A¹ and A³ may be each independently a benzene group, a naphthalene group or a biphenyl group, and A² may be a pyrene group, a perylene group, a benzoperylene group, or a coronene group.

The compound may include a moiety represented by the following Chemical Formula 3.

[Chemical Formula 3]

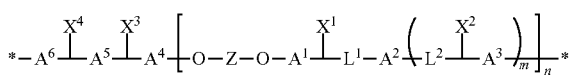

In the above Chemical Formula 3,

A¹ to A⁶ are each independently an aliphatic cyclic group or an aromatic ring group, X¹ to X⁴ are each independently hydrogen, a hydroxy group, a thionyl group, a thiol group, a cyano group, a substituted or unsubstituted amino group, a halogen atom, a halogen-containing group, or a combination thereof, $L^1$ and $L^2$ are each independently a single bond or a substituted or unsubstituted C1 to C6 alkylene group, Z is a metal-containing group represented by the above Chemical Formula 2, m is 0 or 1, and n is an integer of 1 to 15.

The moiety represented by the above Chemical Formula 3 has a structure where the moiety represented by the above Chemical Formula 1 is bonded with a monomer including an aliphatic cyclic group or an aromatic ring group.

The n indicates a repeating number of the moiety represented by the above Chemical Formula 1, and a metal content of the compound may be controlled by adjusting the n.

The metal is the same as described above and therefore description thereof is omitted.

In the above Chemical Formula 3, $A^1$ to $A^6$ may be each independently a substituted or unsubstituted cyclic group selected from Group 1.

In the above Chemical Formula 3, $A^1$, $A^3$, $A^4$, and $A^6$ may be each independently a benzene group, a naphthalene group or a biphenyl group, and $A^2$ and $A^5$ may be each independently a pyrene group, a perylene group, a benzoperylene group, or a coronene group.

At least one of the $A^1$ to $A^6$ may be substituted with a hydroxy group, replacing at least one hydrogen.

For example, the compound may be represented by the following Chemical Formula 4.

[Chemical Formula 4]

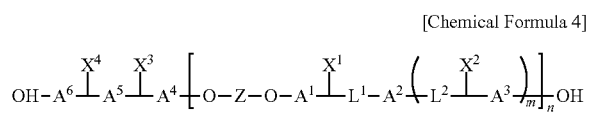

For example, the compound may be represented by the following Chemical Formula 5.

[Chemical Formula 5]

In the above Chemical Formula 5, $X^5$ is hydrogen, a hydroxy group, a thionyl group, a thiol group, a cyano group, a substituted or unsubstituted amino group, a halogen atom, a halogen-containing group, or a combination thereof, and other definitions are the same as described above.

The compound may have a weight average molecular weight of about 1,000 to 200,000. By having the weight average molecular weight within the above range, dissolution and coating properties of resist underlayer composition may be improved. Within the ranges, the compound may have a weight average molecular weight of about 5,000 to 100,000.

The solvent may be anything having sufficient dissolubility or dispersion for the compound, but may be, for example at least one selected from propylene glycol, propylene glycol diacetate, methoxy propanediol, diethylene glycol, diethylene glycol butylether, tri(ethylene glycol) monomethylether, propylene glycol monomethylether, propylene glycol monomethylether acetate, cyclohexanone (or referred to be 'anone'), ethyllactate, gamma-butyrolactone, and acetylacetone.

The compound may be included in an amount of about 0.01 wt % to 50 wt % based on 100 wt % of the solvent. Within the range, solubility and coating properties during a film forming process of the resist underlayer composition may be improved. Within the range, the compound may be included in an amount of about 0.3 wt % to 20 wt %.

The resist underlayer composition may further include an additive of a surfactant and a cross-linking agent and the like.

The surfactant may include, for example alkyl benzenesulfonate salt, alkyl pyridinium salt, a polyethylene glycol, a quaternary ammonium salt, and the like, but is not limited thereto.

The cross-linking agent may cross-link repeating units of the polymer through heating, and may be an amino resin such as etherified amino resin; a glycoluril compound such as a compound represented by the following Chemical Formula A; a bisepoxy compound such as a compound represented by the following Chemical Formula B; melamine or a derivative such as for example N-methoxymethyl melamine, N-butoxymethyl melamine or a melamine derivative represented by the following Chemical Formula C; or a mixture thereof.

[Chemical Formula A]

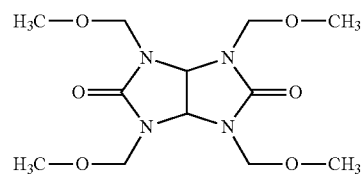

[Chemical Formula B]

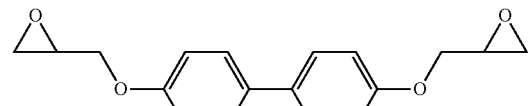

[Chemical Formula C]

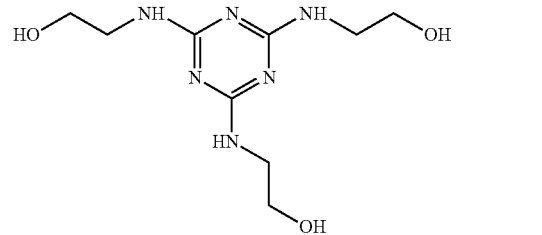

The surfactant and cross-linking agent may be included in each amount of about 0.001 wt % to 3 wt % based on 100 wt % of the resist underlayer composition. When included in the range, the solubility and the cross-linking property may be ensured while not changing the optical properties of the resist underlayer composition.

The resist underlayer composition may be chemically stable during the process since it is not dissolved in a resist solvent and/or a resist developing solution and is not mixed with the resist solution.

Hereinafter, a method of forming patterns using the resist underlayer composition is described.

The method of forming patterns according to one embodiment includes providing a material layer on a substrate, applying a resist underlayer composition including the compound and a solvent on the material layer, heat-treating the resist underlayer composition to form a resist underlayer, forming a resist layer on the resist underlayer, exposing and developing the resist layer to form a resist pattern, selectively removing the resist underlayer using the resist pattern to expose a part of the material layer, and etching an exposed part of the material layer.

The substrate may be, for example, a silicon wafer, a glass substrate, or a polymer substrate.

The material layer is a material to be finally patterned and may be, for example, a metal layer such as aluminum, copper or the like, a semiconductor layer such as silicon, or an insulation layer such as silicon oxide, silicon nitride or the like. The material layer may be obtained by, for example, chemical vapor deposition (CVD).

The resist underlayer composition may be prepared in a solution and may be applied by a spin-on-coating method. In this case, the coating thickness of resist underlayer composition is not specifically limited, but it may be coated in a thickness of, for example, about 80 to 10,000 Å.

Before forming the resist underlayer, a bottom anti-reflective coating (BARC) may be further formed.

The resist underlayer composition may be heat-treated at, for example, about 150 to 500° C. During the heat-treating, the compound may be cross-linked.

The exposing of the resist layer may be performed by using, for example, ArF, KrF, or EUV or the like. In addition, after the exposure, the heat-treating may be performed at about 100 to 500° C.

The exposed part of the material layer may be etched by dry etching using etching gas, and the etching gas may include for example, $CHF_3$, $CF_4$, $Cl_2$, $BCl_3$, and a mixed gas thereof.

The etched material layer may be formed in a plurality of patterns, and the plurality of patterns may be various such as metal pattern, semiconductor pattern, insulation pattern, or the like. For example, it may be applied to various patterns in a semiconductor integrated circuit device.

The patterns in the semiconductor integrated circuit device may be, for example a metal wire; a semiconductor pattern; an insulation layer including a contact hole, a bias hole, damascene trench, and the like.

MODE FOR INVENTION

Hereinafter, the present disclosure is illustrated in more detail with reference to examples. However, these examples are exemplary, and the present disclosure is not limited thereto.

SYNTHESIS EXAMPLE 1

Step 1: Friedel-Craft Acylation 50.1 g of coronene and 28.4 g of 4-methoxybenzoyl chloride were put in a flask, 200 mL of 1,2-dichloroethane was added thereto, and the mixture was agitated at room temperature for 10 minutes. Subsequently, 22.2 g of aluminum chloride was slowly added to the resultant, and the mixture was heated up to 60° C. and agitated for 8 hours. When the reaction was complete, methanol was added to the agitated resultant, and then, a precipitate formed therein was filtered, obtaining 4-methoxybenzoyl coronene.

Step 2: Demethylation Reaction 50 g of the 4-methoxybenzoyl coronene obtained in Step 1, 58.2 g of 1-dodecanethiol, and 19.4 g of potassium hydroxide were put in a flask, 180 mL of N,N-dimethylformamide was added thereto, and the mixture was agitated at 120° C. for 8 hours. Subsequently, the mixture was cooled down, neutralized to about pH 7 with a 10% hydrogen chloride solution, and extracted with ethyl acetate, obtaining 4-hydroxybenzoyl coronene.

Step 3: Formation Reaction of Metal Composite 25.0 g of the 4-hydroxybenzoyl coronene obtained in Step 2 was dissolved in 100 mL of tetrahydrofuran, 8.5 g of titanium isopropoxide was added thereto, and the mixture was reacted at room temperature for 12 hours. When the reaction was complete, the resultant was dried, obtaining a compound represented by the following Chemical Formula A1.

[Chemical Formula A1]

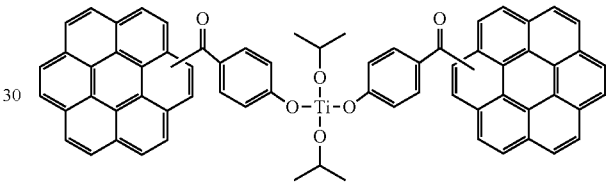

Step 4: Reduction Reaction 10.0 g of the compound obtained in Step 3 was put in a flask, and 50 mL of tetrahydrofuran was added thereto, to prepare a solution. 7.6 g of a sodium borohydride aqueous solution was slowly added to the solution, and the mixture was agitated at room temperature for 24 hours. When the reaction was complete, the resultant was neutralized to about pH 7 with a 10% hydrogen chloride solution and extracted with ethyl acetate, obtaining a compound represented by the following Chemical Formula A2. The molecular weight of the compound represented by the following Chemical Formula A2 was 1,008.97.

[Chemical Formula A2]

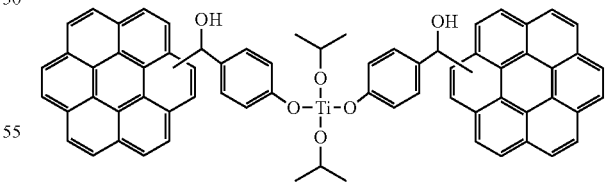

SYNTHESIS EXAMPLE 2

Step 1: Friedel-Craft Acylation 50.0 g of coronene and 56.8 g of 4-methoxybenzoyl chloride were put in a flask, 400 mL of 1,2-dichloroethane was added thereto, and the mixture was agitated at room temperature for 10 minutes. Subsequently, 44.4 g of aluminum chloride was slowly added to the resultant, and the mixture was heated up to 60° C. and agitated for 8 hours. When the reaction was complete, methanol was added to the resultant, and a precipitate produced therein was filtered, obtaining a double-substituted 4-methoxybenzoyl coronene.

Step 2: Demethylation Reaction 50 g of the double-substituted 4-methoxybenzoyl coronene the Step 1, 89.0 g of 1-dodecanethiol, and 29.6 g of potassium hydroxide were put in a flask, 250 mL of N,N-dimethylformamide was added thereto, and the mixture was agitated at 120° C. for 8 hours. Subsequently, the resultant was cooled down, neutralized to about pH 7 with a 10% hydrogen chloride solution, and extracted with ethyl acetate, obtaining a double-substituted 4-hydroxybenzoyl coronene.

Step 3: Formation Reaction of Metal Composite 25 g of the double-substituted 4-hydroxybenzoyl coronene obtained in Step 2 was dissolved in 100 mL of tetrahydrofuran, 6.6 g of titanium isopropoxide was added thereto, and the mixture was reacted at room temperature for 12 hours. When the reaction was complete, the solvent in the resultant was evaporated, obtaining a compound represented by the following Chemical Formula B1.

[Chemical Formula B1]

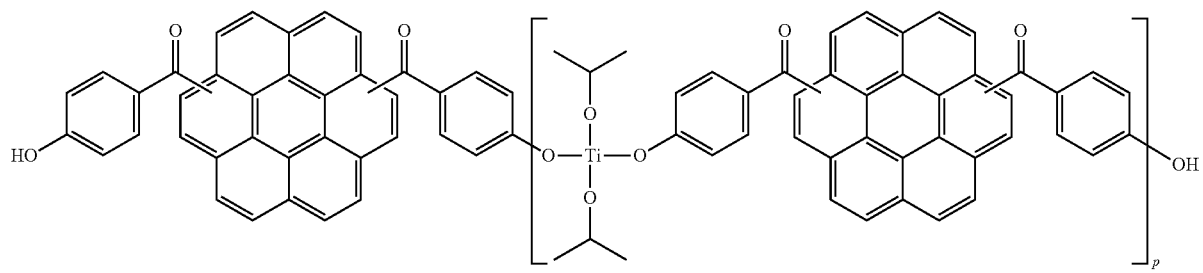

In the above Chemical Formula B1, $1 \leq p \leq 15$, and p is an integer.

Step 4: Reduction Reaction 10.0 g of the compound represented by Chemical Formula B1 and obtained in Step 3 was put in a flask, and 50 mL of tetrahydrofuran was added thereto to prepare a solution. 12.2 g of a sodium borohydride aqueous solution was slowly added to the solution, and the mixture was agitated at room temperature for 24 hours. When the reaction was complete, the resultant was neutralized to about pH 7 with a 10% hydrogen chloride solution and extracted with ethyl acetate, obtaining a compound represented by the following Chemical Formula B2. The molecular weight of the compound represented by the following Chemical Formula B2 was in a range of about 1,200 to 14,000.

In the above Chemical Formula B2, $1 \leq p \leq 15$, and p is an integer.

SYNTHESIS EXAMPLE 3

Step 1: Friedel-Craft Acylation 20.6 g of terephthaloyl chloride and 47.0 g of 4-methoxypyrene were put in a flask, 250 mL of 1,2-dichloroethane was added thereto, and the mixture was agitated at room temperature for 10 minutes. Subsequently, 27 g of aluminum chloride was slowly added to the resultant, and the mixture was heated up to 60° C. and agitated for 8 hours. When the reaction was complete, methanol was added to the resultant, and a precipitate produced therein was filtered, obtaining bis(methoxypyrenylcarbonyl)benzene.

Step 2: Demethylation Reaction 53.5 g of the bis(methoxypyrenylcarbonyl)benzene obtained in Step 1 and 30.3 g of 1-dodecanethiol 91.1 g and potassium hydroxide were put in a flask, 250 mL of N,N-dimethylformamide was added to the flask, and the mixture was agitated at 120° C. for 8 hours. Subsequently, the agitated mixture was cooled down and neutralized to about pH 7 with a 5% hydrogen chloride solution, and a precipitate produced therein was filtered, obtaining bis(hydroxypyrenylcarbonyl)benzene.

[Chemical Formula B2]

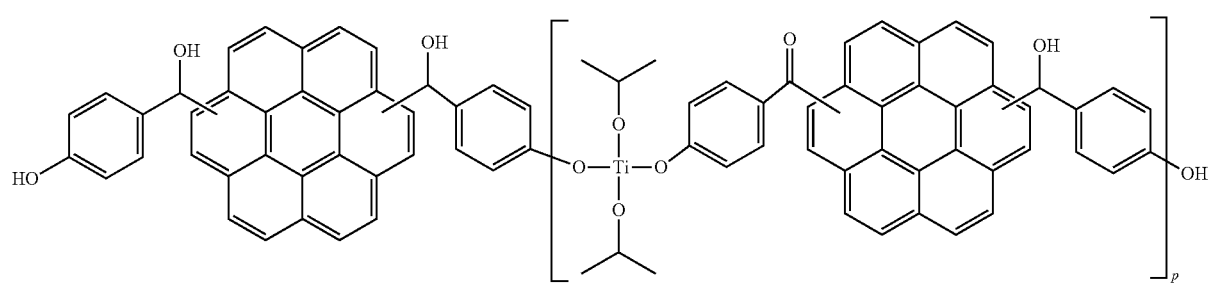

Step 3: Formation Reaction of Metal Composite 25 g of the bis(hydroxypyrenylcarbonyl)benzene obtained in Step 2 was dissolved in 100 mL of tetrahydrofuran, 6.3 g of titanium isopropoxide was added thereto, and the mixture was reacted at room temperature for 12 hours. When the reaction was complete, the resultant was dried, obtaining a compound represented by the following Chemical Formula C1.

[Chemical Formula C1]

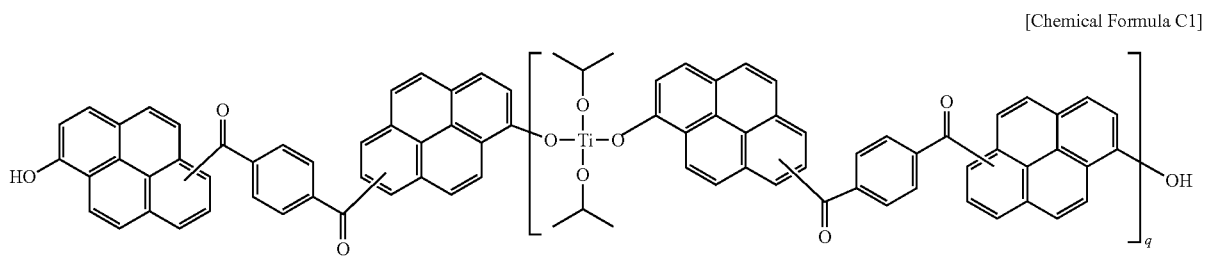

In the above Chemical Formula C1, $1 \leq q \leq 15$, and q is an integer.

Step 4: Reduction Reaction 10.0 g of the compound represented by Chemical Formula C1 and obtained in Step 3 was put in a flask, and 50 mL of tetrahydrofuran was added thereto to prepare a solution. 11.7 g of a sodium borohydride aqueous solution was slowly added to the solution, and the mixture was agitated at room temperature for 24 hours. When the reaction was complete, the resultant was neutralized to about pH 7 with a 10% hydrogen chloride solution and extracted with ethyl acetate, obtaining a compound represented by the following Chemical Formula C2. The molecular weight of the compound represented by the following Chemical Formula C2 was in a range of about 1,200 to about 12,000.

In the above Chemical Formula C2, $1 \leq q \leq 15$, and q is an integer.

SYNTHESIS EXAMPLE 4

Step 1: Friedel-Craft Acylation 20.0 g of isophthaloyl chloride and 45.8 g of 4-methoxypyrene were put in a flask, 250 mL of 1,2-dichloroethane was added thereto, and the mixture was agitated at room temperature for 10 minutes. Subsequently, 26.3 g of aluminum chloride was slowly added to the resultant, and the mixture was heated up to 60° C. and agitated for 8 hours. When the reaction was complete, methanol was added to the resultant, and a precipitate produced therein was filtered, obtaining bis(methoxypyrenylcarbonyl)benzene.

Step 2: Demethylation Reaction 50.0 g of the bis(methoxypyrenylcarbonyl)benzene obtained in Step 1, 85.1 g of 1-dodecanethiol, and 28.3 g of potassium hydroxide were put in a flask, 250 mL of N,N-dimethylformamide was added thereto, and the mixture was agitated at 120° C. for 8 hours. Subsequently, the mixture was cooled down and neutralized to about pH 7 with a 5%

[Chemical Formula C2]

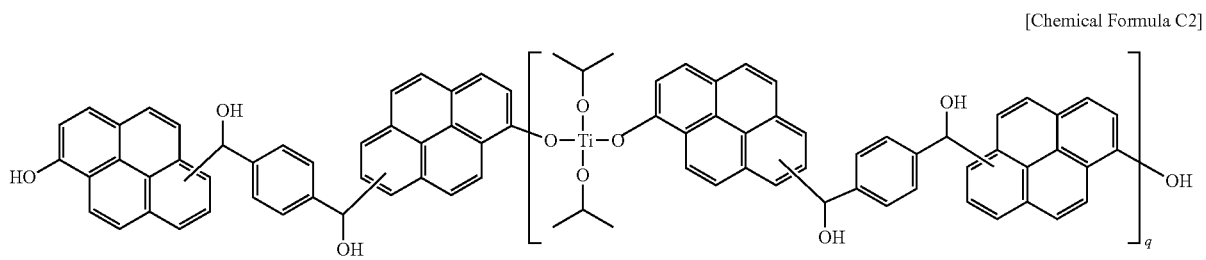

hydrogen chloride solution, and a precipitate produced therein was filtered, obtaining bis(hydroxypyrenylcarbonyl)benzene.

Step 3: Formation Reaction of Metal Composite 25 g of the bis(hydroxypyrenylcarbonyl)benzene obtained in Step 2 was dissolved in 100 mL of tetrahydrofuran, 6.3 g of titanium isopropoxide was added thereto, and the mixture was reacted at room temperature for 12 hours. When the reaction was complete, a compound represented by the following Chemical Formula D1 was obtained.

[Chemical Formula D1]

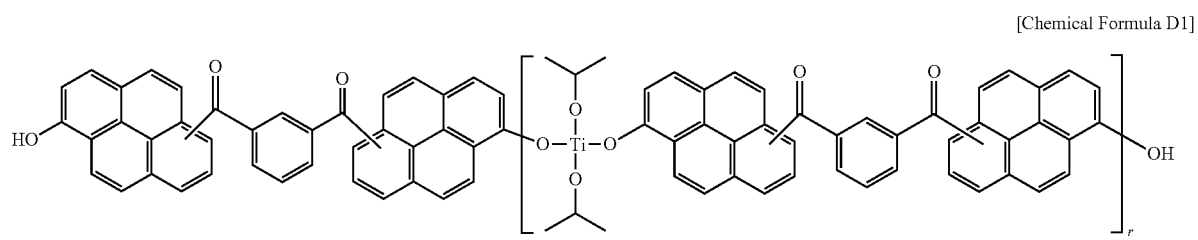

In the above Chemical Formula D1, 1≤r≤15, and r is an integer.

Step 4: Reduction Reaction 10.0 g of the compound D1 obtained in Step 3 was put in a flask, and 50 mL of tetrahydrofuran was added thereto to prepare a solution. 11.7 g of a sodium borohydride aqueous solution was slowly added to the solution, and the mixture was agitated at room temperature for 24 hours. When the reaction was complete, the resultant was neutralized to about pH 7 with a 10% hydrogen chloride solution and extracted with ethyl acetate, obtaining a compound represented by the following Chemical Formula D2. The molecular weight of the compound represented by the following Chemical Formula D2 was in a range of about 1,200 to about 12,000.

In the above Chemical Formula D2, 1≤r≤15, and r is an integer.

COMPARATIVE SYNTHESIS EXAMPLE 1

First Step: Friedel-Craft Acylation Reaction 50.0 g of coronene, 23.4 g of benzoylchloride, and 330 g of 1,2-dichloroethane were put in a flask to prepare a solution. Subsequently, 22.2 g of aluminum chloride was slowly added to the solution at room temperature, and the mixture was heated up to 60° C. and agitated for 8 hours. When the reaction was complete, a precipitate produced by adding methanol to the solution was filtered, obtaining benzoyl coronene.

Second Step: Reduction Reaction 25.0 g of the double-substituted benzoyl coronene obtained in the first step and 174 g of tetrahydrofuran were put in a flask to prepare a solution. 18.6 g of a sodium borohydride aqueous solution was slowly added to the solution, and the mixture was agitated at room temperature for 24 hours. When the reaction was complete, a 10% hydrogen chloride solution was neutralized to about pH 7 and extracted with ethyl acetate, obtaining a monomer represented by the following Chemical Formula E.

[Chemical Formula D2]

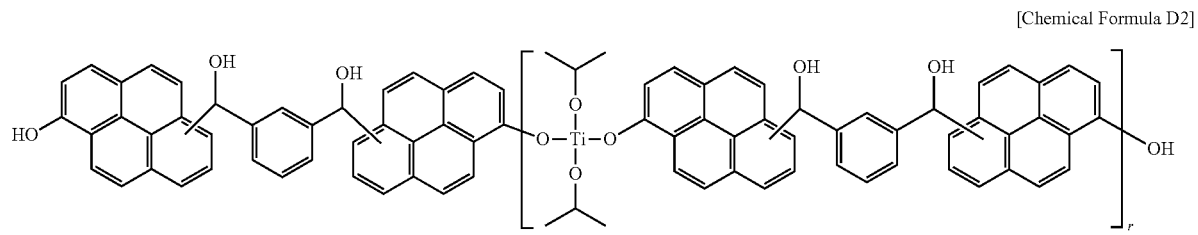

[Chemical Formula E]

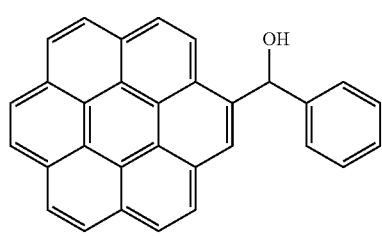

COMPARATIVE SYNTHESIS EXAMPLE 2

First Step: Friedel-Craft Acylation Reaction 50.0 g (0.166 mol) of coronene, 46.8 g (0.333 mol) of benzoylchloride, 330 g of 1,2-dichloroethane were put in a flask to prepare a solution. Subsequently, 44.4 g (0.333 mol) of aluminum chloride was slowly added to the solution at room temperature, and the mixture was agitated up to 60° C. for 8 hours. When the reaction was complete, a precipitate produced by adding methanol to the solution was filtered, obtaining a double-substituted benzoyl coronene.

Second Step: Reduction Reaction 25.0 g (0.0492 mol) of the double-substituted benzoyl coronene obtained in the first step and 174 g of tetrahydrofuran were put in a flask to prepare a solution. 18.6 g (0.492 mol) of a sodium borohydride aqueous solution was slowly added to the solution, and the mixture was agitated at room temperature for 24 hours. When the reaction was complete, the resultant was neutralized to about pH 7 with a 10% hydrogen chloride solution and extracted with ethyl acetate, obtaining a monomer represented by the following Chemical Formula F.

[Chemical Formula F]

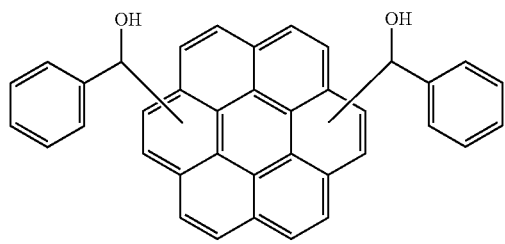

COMPARATIVE SYNTHESIS EXAMPLE 3

First Step: Friedel-Craft Acylation Reaction 13.9 g (0.0989 mol) of benzoyl chloride, 10.0 g (0.0495 mol) of pyrene, and 87 g of 1,2-dichloroethane were put in a flask. 13.2 g (0.0989 mol) of aluminum chloride was slowly added to the solution at room temperature, and the mixture was heated up to 60° C. and agitated for 8 hours. When the reaction was complete, methanol was added to the resultant, and a precipitate produced therein was filtered, obtaining dibenzoylpyrene.

Second Step: Reduction Reaction 5.00 g (0.0122 mol) of the dibenzoylpyrene and 57 g of tetrahydrofuran were put in a flask. 4.60 g (0.122 mol) of a sodium borohydride aqueous solution was slowly added to the solution, and the mixture was agitated at room temperature for 24 hours. When the reaction was complete, the resultant was neutralized to about pH 7 with a 5% hydrogen chloride solution and extracted with ethylacetate, obtaining a monomer represented by the following Chemical Formula G.

[Chemical Formula G]

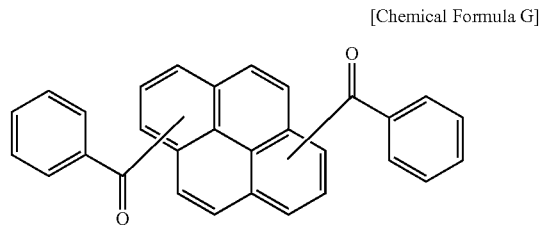

COMPARATIVE SYNTHESIS EXAMPLE 4

8.75 g (0.05 mol) of α,α'-dichloro-p-xylene, 26.66 g of aluminum chloride, and 200 g of γ-butyrolactone were put in a flask. A solution prepared by dissolving 35.03 g (0.10 mol) of 4,4'-(9-fluorenylidene)diphenol in 200 g of γ-butyrolactone was slowly added to the solution, and the mixture was agitated at 120° C. for 12 hours. After the polymerization, water was used to remove acid from the resultant, and the remnant was concentrated. Subsequently, the polymerized product was diluted by using methylamylketone and methanol, and a solution including methylamylketone/methanol=4/1 (a weight ratio) in a concentration of 15 wt % was added thereto to adjust the concentration of the mixture. This solution was put in a separatory funnel, and n-heptane was added thereto to remove a monomer and a low molecular weight, obtaining a polymer represented by the following Chemical Formula H.

[Chemical Formula H]

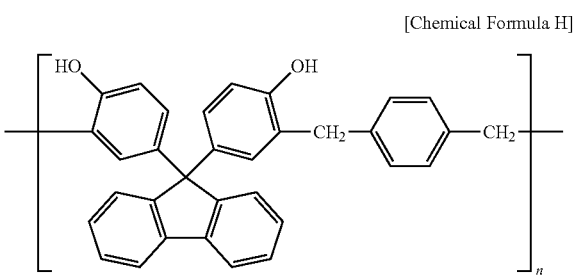

The polymer had a weight average molecular weight of 12,000 and polydispersity of 2.04.

PREPARATION OF RESIST UNDERLAYER COMPOSITION

EXAMPLE 1

1 g of the compound represented by Chemical Formula A2 and obtained in Synthesis Example 1 was dissolved in 9 g of propylene glycolmonomethyl ether acetate (PGMEA), and the solution was filtered, obtaining a resist underlayer composition.

EXAMPLE 2

A resist underlayer composition was prepared according to the same method as Example 1 except for using the compound represented by Chemical Formula B2 and obtained in Synthesis Example 2 instead of the compound obtained in Synthesis Example 1.

EXAMPLE 3

A resist underlayer composition was prepared according to the same method as Example 1 except for using the compound represented by Chemical Formula C2 and obtained in Synthesis Example 3 instead of the compound obtained in Synthesis Example 1.

EXAMPLE 4

A resist underlayer composition was prepared according to the same method as Example 1 except for using the compound represented by Chemical Formula D2 and obtained in Synthesis Example 4 instead of the compound obtained in Synthesis Example 1.

COMPARATIVE EXAMPLE 1

A resist underlayer composition was prepared according to the same method as Example 1 except for using the compound obtained in Comparative Synthesis Example 1 instead of the compound obtained in Synthesis Example 1.

COMPARATIVE EXAMPLE 2

A resist underlayer composition was prepared according to the same method as Example 1 except for using the compound obtained in Comparative Synthesis Example 2 instead of the compound obtained in Synthesis Example 1.

COMPARATIVE EXAMPLE 3

A resist underlayer composition was prepared according to the same method as Example 1 except for using the compound obtained in Comparative Synthesis Example 3 instead of the compound obtained in Synthesis Example 1.

COMPARATIVE EXAMPLE 4

A resist underlayer composition was prepared according to the same method as Example 1 except for using the compound obtained in Comparative Synthesis Example 4 instead of the compound obtained in Synthesis Example 1.

Evaluation 1: Optical Properties

Each resist underlayer composition according to Examples 1 to 4 and Comparative Examples 1 to 4 was spin-coated on a silicon wafer and baked at 200° C. for 60 seconds to form a 4,000 Å-thick resist underlayer. The refractive index (n) and extinction coefficient (k) of each hardmask layer were measured by using Ellipsometer (J. A. Woollam).

The results are shown in Table 1.

TABLE 1

| | Optical properties (193 nm) | | Optical properties (248 nm) | |
|---|---|---|---|---|
| | n (refractive index) | k (extinction coefficient) | n (refractive index) | k (extinction coefficient) |
| Example 1 | 1.47 | 0.72 | 1.99 | 0.40 |
| Example 2 | 1.42 | 0.64 | 2.03 | 0.25 |
| Example 3 | 1.53 | 0.69 | 1.95 | 0.30 |
| Example 4 | 1.44 | 0.77 | 1.89 | 0.29 |
| Comparative Example 1 | 1.47 | 0.80 | 2.06 | 0.39 |
| Comparative Example 2 | 1.45 | 0.72 | 2.01 | 0.21 |
| Comparative Example 3 | 1.52 | 0.71 | 2.07 | 0.33 |
| Comparative Example 4 | 1.48 | 0.71 | 1.98 | 0.22 |

Referring to Table 1, the resist underlayer compositions according to Examples 1 to 4 showed a refractive index and an absorption degree usable as an antireflective film at ArF (193 nm) and KrF (248 nm) wavelengths.

Evaluation 2: Chemical Resistance

Each resist underlayer composition according to Examples 1 to 4 and Comparative Examples 1 to 3 was respectively spin-coated on a silicon wafer and heat-treated at 240° C. for 120 seconds to form a thin film, and then, the thickness of the thin film was measured, and the surface of the film was examined. Subsequently, the thin film was dipped in a KrF thinner for one minute, and then, its thickness was measured and its surface was examined.

Then, a thin film was formed under the same condition as above except for changing the heat treatment temperature from 240° C. to 400° C., and then, its thickness was measured, and its surface was examined.

A thickness decrease rate was calculated according to the following Calculation Equation 1 based on thin film thicknesses before and after dipping.

Thickness decrease rate (%)=(thin film thickness before dipping−thin film thickness after dipping)/thin film thickness before dipping× 100    [Calculation Equation 1]

The results are shown in Table 2.

TABLE 2

| | 240° C. condition | | 400° C. condition | |
|---|---|---|---|---|
| | Stains on surface of thin film | Thickness decrease rates between before and after being dipped in thinner | Stains on surface of thin film | Thickness decrease rates between before and after being dipped in thinner |
| Example 1 | X | 0.20 | X | 0.15 |
| Example 2 | X | 0.16 | X | 0.06 |
| Example 3 | X | 0.07 | X | 0.02 |
| Example 4 | X | 0.12 | X | 0.10 |
| Comparative Example 1 | X | 0.44 | X | 0.30 |

TABLE 2-continued

| | 240° C. condition | | 400° C. condition | |
|---|---|---|---|---|
| | Stains on surface of thin film | Thickness decrease rates between before and after being dipped in thinner | Stains on surface of thin film | Thickness decrease rates between before and after being dipped in thinner |
| Comparative Example 2 | X | 0.38 | X | 0.23 |
| Comparative Example 3 | X | 0.81 | X | 0.59 |

The thin films formed from the resist underlayer compositions according to Examples 1 to 4 had no spot on the surface at both of 240° C. and 400° C. and showed excellent chemical resistance.

In addition, the thin films formed from the resist underlayer compositions according to Examples 1 to 4 showed a small thickness change compared with the thin films formed from the resist underlayer compositions according to Comparative Examples 1 to 3.

The reason is that the resist underlayer compositions according to Examples 1 to 4 were relatively more highly cross-linked than the resist underlayer compositions according to Comparative Examples 1 to 3 and thus, showed excellent chemical resistance compared with the resist underlayer compositions according to Comparative Examples 1 to 3.

Evaluation 3: Etch Resistance

Each resist underlayer composition according to Examples 1 to 4 and Comparative Examples 1 to 4 was spin-coated on a silicon wafer and heat-treated at 240° C. for 120 seconds to form a thin film, and thickness of the thin film was measured.

Subsequently, the thin film was dry-etched for 60 seconds by using a $N_2/O_2$ mixed gas, and thickness of the thin film was measured. In addition, the thin film was dry-etched for 100 seconds by using $CF_x$ gas, and then, thickness of the thin film was measured.

A bulk etching rate (BER) was calculated according to the following Calculation Equation 2 based on thickness of the thin film and etching time before and after the dry etching.

Bulk etching rate (BER)=(Initial thickness of thin film−thickness of thin film after etching)/etching time (Å/s)    [Calculation Equation 2]

The results are shown in Table 3.

TABLE 3

| | $CF_x$ | $N_2/O_2$ |
|---|---|---|
| Example 1 | 14.4 | 11.6 |
| Example 2 | 15.2 | 13.3 |
| Example 3 | 13.3 | 10.8 |
| Example 4 | 13.0 | 10.2 |
| Comparative Example 1 | 26.3 | 23.8 |
| Comparative Example 2 | 26.2 | 23.3 |
| Comparative Example 3 | 25.4 | 22.0 |
| Comparative Example 4 | 27.8 | 25.0 |

Referring to Table 3, the thin films formed from the resist underlayer compositions according to Examples 1 to 4 had sufficient etch resistance against etching gas and showed a low etching rate compared with the thin films formed from the hardmask compositions according to Comparative Examples 1 to 4.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A resist underlayer composition, comprising:
a solvent; and
a compound that includes a moiety represented by the following Chemical Formula 1:

[Chemical Formula 1]

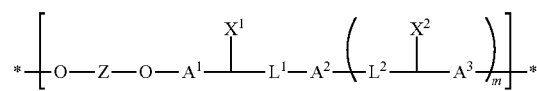

wherein, in Chemical Formula 1,
$A^1$ to $A^3$ are each independently an aliphatic cyclic group or an aromatic ring group,
$X^1$ and $X^2$ are each independently hydrogen, a hydroxy group, a thionyl group, a thiol group, a cyano group, a substituted or unsubstituted amino group, a halogen atom, a halogen-containing group, or a combination thereof,
$L^1$ and $L^2$ are each independently a single bond or a substituted or unsubstituted C1 to C6 alkylene group,
Z is a metal-containing group represented by the following Chemical Formula 2, and
m is 0 or 1,

[Chemical Formula 2]

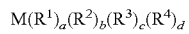

wherein, in the above Chemical Formula 2,
M is a metal,
$R^1$, $R^2$, $R^3$ and $R^4$ are each independently one of hydrogen, a hydroxy group, a substituted or unsubstituted C1 to C10 alkyl group, a substituted or unsubstituted C6 to C10 aryl group, an allyl group, a halogen atom, a substituted or unsubstituted amino group, and a substituted or unsubstituted C1 to C10 alkoxy group, and
a, b, c, and d are each independently 0 or 1.

2. The resist underlayer composition of claim 1, wherein the metal is Sc, Ti, V, Cr, Mn, Fe, Co, Ni, Cu, Zn, Zr, Mo, Ag, Cd, Pt, Au, Hf, Rf, or Rg.

3. The resist underlayer composition of claim 1, wherein $A^1$ to $A^3$ are each independently one of the following substituted or unsubstituted cyclic groups:

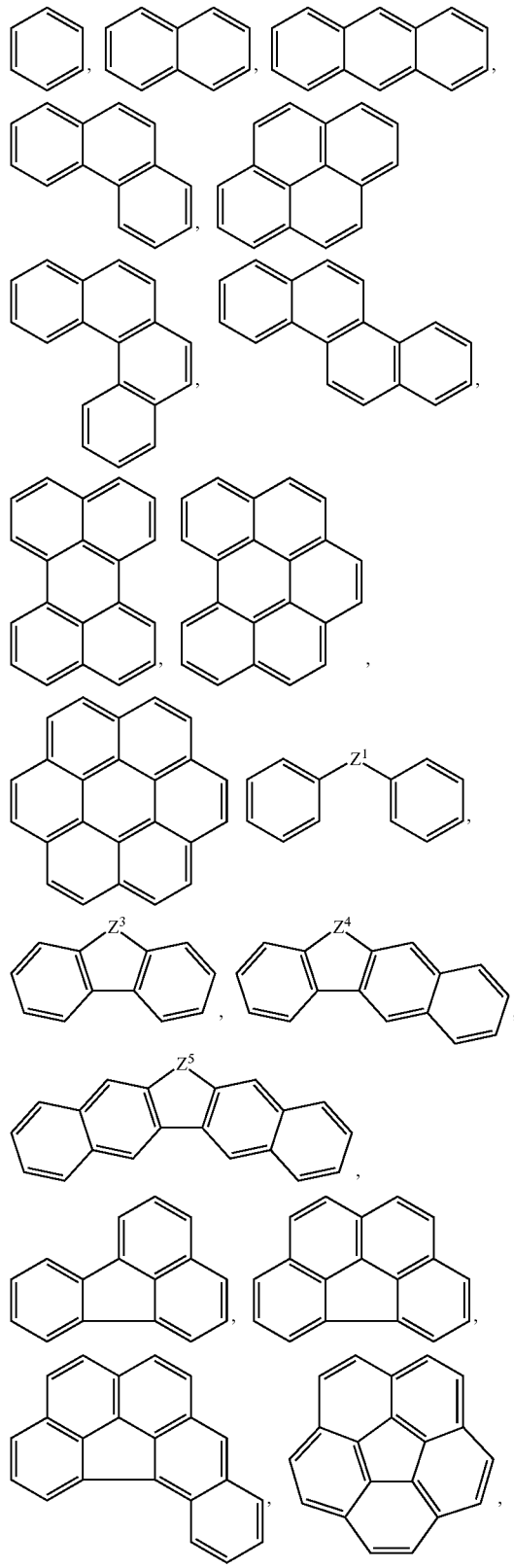

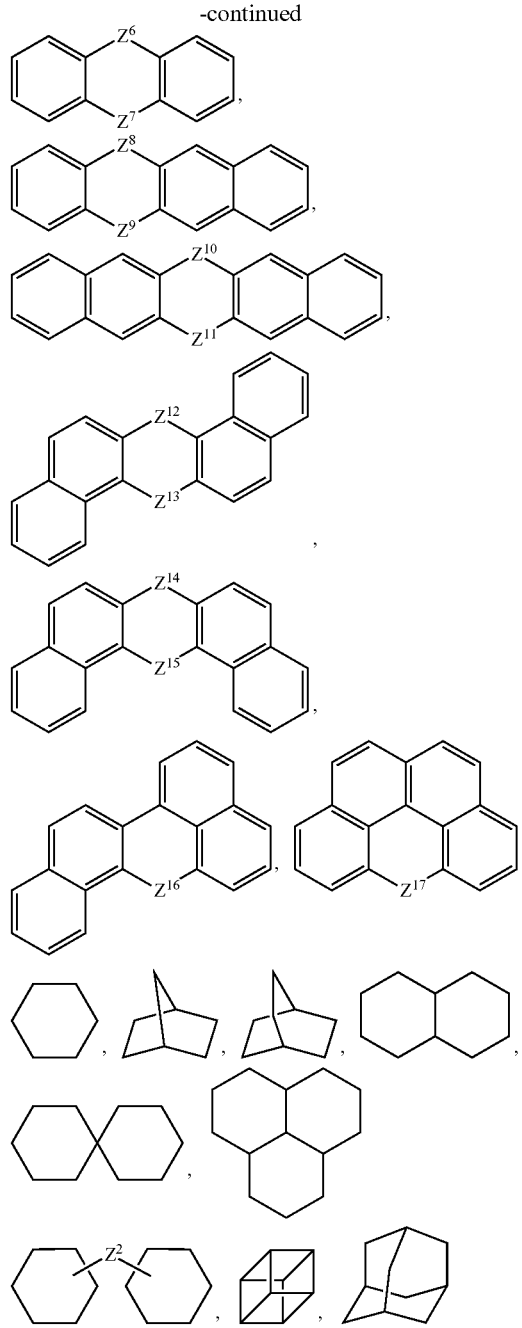

wherein, $Z^1$ and $Z^2$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, NR$^a$, oxygen (O), sulfur (S), or a combination thereof, wherein R$^a$ is hydrogen, a substituted or unsubstituted C1 to C10 alkyl group, a halogen atom, or a combination thereof, and $Z^3$ to $Z^{17}$ are each independently C=O, NR$^a$, oxygen (O), sulfur (S), CR$^b$R$^c$, or a combination thereof, wherein R$^a$ to R$^c$ are each independently hydrogen, a substituted or unsubstituted C1 to C10 alkyl group, a halogen atom, a halogen-containing group, or a combination thereof.

4. The resist underlayer composition of claim 1, wherein at least one of A$^1$ to A$^3$ is a polycyclic aromatic group.

5. The resist underlayer composition of claim 4, wherein:
A$^1$ and A$^3$ are each independently a benzene group, a naphthalene group, or a biphenyl group, and
A$^2$ is a pyrene group, a perylene group, a benzoperylene group, or a coronene group.

6. The resist underlayer composition of claim 1, wherein the compound includes a moiety represented by the following Chemical Formula 3:

[Chemical Formula 3]

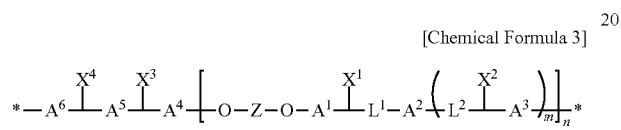

wherein, in Chemical Formula 3,
A$^1$ to A$^6$ are each independently an aliphatic cyclic group or an aromatic ring group,
X$^1$ to X$^4$ are each independently hydrogen, a hydroxy group, a thionyl group, a thiol group, a cyano group, a substituted or unsubstituted amino group, a halogen atom, a halogen-containing group, or a combination thereof, L$^1$ and L$^2$ are each independently a single bond or a substituted or unsubstituted C1 to C6 alkylene group,
Z is a metal-containing group represented by the above Chemical Formula 2,
m is 0 or 1, and
n is an integer of 1 to 15,

[Chemical Formula 2]

M(R$^1$)$_a$(R$^2$)$_b$(R$^3$)$_c$(R$^4$)$_d$ wherein, in the above Chemical Formula 2,
M is a metal,
R$^1$, R$^2$, R$^3$, and R$^4$ are each independently one of hydrogen, a hydroxy group, a substituted or unsubstituted C1 to C10 alkyl group, a substituted or unsubstituted C6 to C10 aryl group, an allyl group, a halogen atom, a substituted or unsubstituted amino group, and a substituted or unsubstituted C1 to C10 alkoxy group, and
a, b, c, and d are each independently 0 or 1.

7. The resist underlayer composition of claim 6, wherein the metal is Sc, Ti, V, Cr, Mn, Fe, Co, Ni, Cu, Zn, Zr, Mo, Ag, Cd, Pt, Au, Hf, Rf, or Rg.

8. The resist underlayer composition of claim 6, wherein A$^1$ to A$^6$ each independently one of the following substituted or unsubstituted cyclic groups:

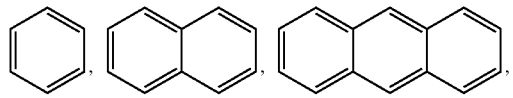

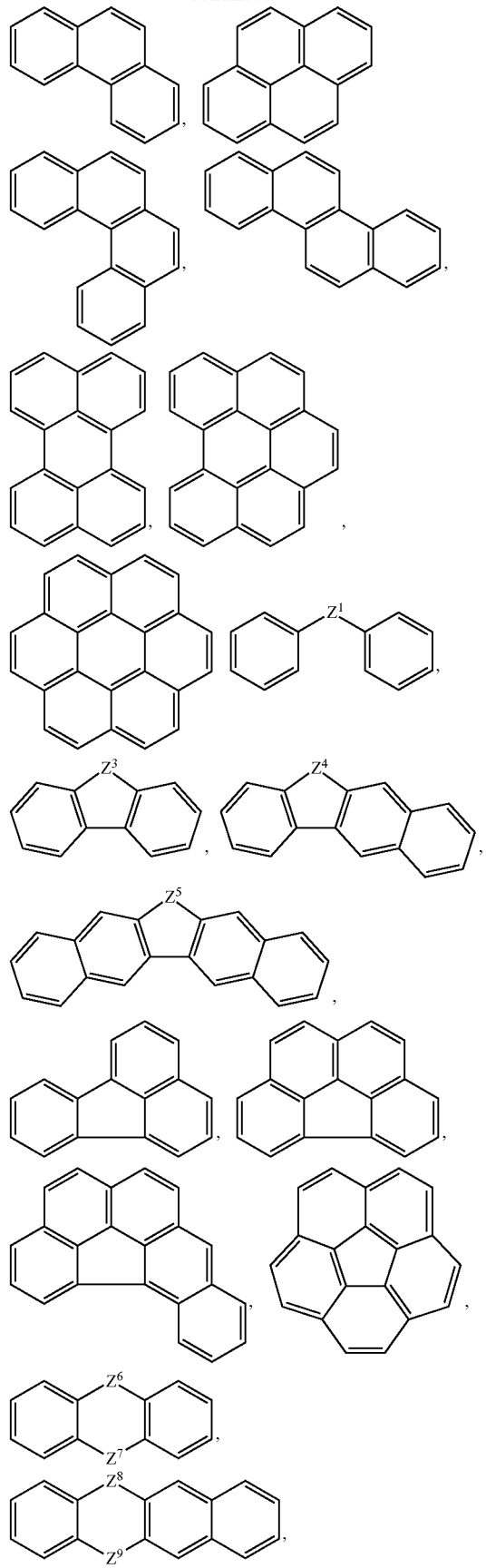

-continued

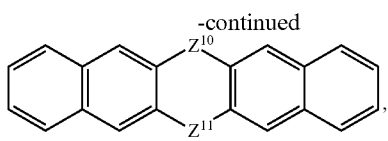

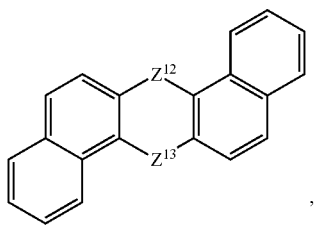

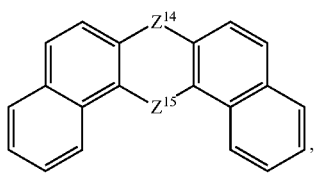

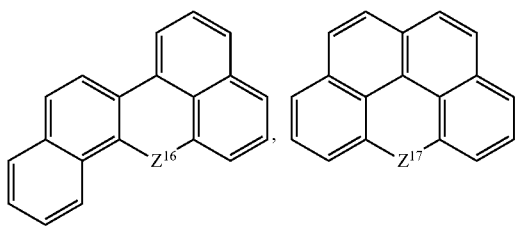

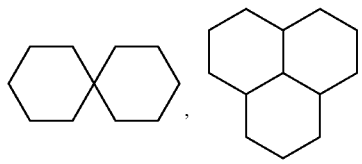

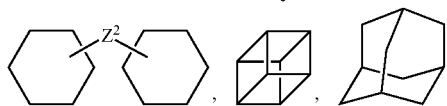

wherein, $Z^1$ and $Z^2$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, NR$^a$, oxygen (O), sulfur (S), or a combination thereof, wherein R$^a$ is hydrogen, a substituted or unsubstituted C1 to C10 alkyl group, a halogen atom, or a combination thereof, and $Z^3$ to $Z^{17}$ are each independently C=O, NR$^a$, oxygen (O), sulfur (S), CR$^b$R$^c$, or a combination thereof, wherein R$^a$ to R$^c$ are each independently hydrogen, a substituted or unsubstituted C1 to C10 alkyl group, a halogen atom, a halogen-containing group, or a combination thereof.

9. The resist underlayer composition of claim 6, wherein:

$A^1$, $A^3$, $A^4$, and $A^6$ are each independently a benzene group, a naphthalene group, or a biphenyl group, and $A^2$ and $A^5$ are each independently a pyrene group, a perylene group, a benzoperylene group, or a coronene group.

10. The resist underlayer composition of claim 6, wherein the compound is represented by the following Chemical Formula 4:

[Chemical Formula 4]

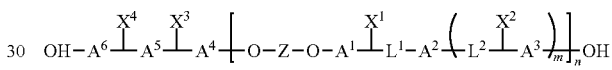

wherein, in Chemical Formula 4, $A^1$ to $A^6$ are each independently an aliphatic cyclic group or an aromatic ring group, $X^1$ to $X^4$ are each independently hydrogen, a hydroxy group, a thionyl group, a thiol group, a cyano group, a substituted or unsubstituted amino group, a halogen atom, a halogen-containing group, or a combination thereof, $L^1$ and $L^2$ are each independently a single bond or a substituted or unsubstituted C1 to C6 alkylene group, Z is a metal-containing group represented by the following Chemical Formula 2, m is 0 or 1, and n is an integer of 1 to 15,

[Chemical Formula 2]

$$M(R^1)_a(R^2)_b(R^3)_c(R^4)_d$$

wherein, in the above Chemical Formula 2,

M is a metal, $R^1$, $R^2$, $R^3$, and $R^4$ are each independently one of hydrogen, a hydroxy group, a substituted or unsubstituted C1 to C10 alkyl group, a substituted or unsubstituted C6 to C10 aryl group, an allyl group, a halogen atom, a substituted or unsubstituted amino group, and a substituted or unsubstituted C1 to C10 alkoxy group, and a, b, c, and d are each independently 0 or 1.

11. The resist underlayer composition of claim 1, wherein the compound is represented by the following Chemical Formula 5:

[Chemical Formula 5]

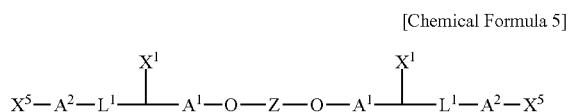

wherein, in Chemical Formula 5, $A^1$ and $A^2$ are each independently an aliphatic cyclic group or an aromatic ring group, $X^1$ and $X^5$ are each independently hydrogen, a hydroxy group, a thionyl group, a thiol group, a cyano group, a substituted or unsubstituted amino group, a halogen atom, a halogen-containing group, or a combination thereof, each $L^1$ is independently a single bond or a substituted or unsubstituted C1 to C6 alkylene group, and Z is a metal-containing group represented by the above Chemical Formula 2,

[Chemical Formula 2]

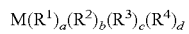

wherein, in Chemical Formula 2,

M is a metal, $R^1, R^2, R^3$, and $R^4$ are each independently one of hydrogen, a hydroxy group, a substituted or unsubstituted C1 to C 10 alkyl group, a substituted or unsubstituted C6 to C 10 aryl group, an allyl group, a halogen atom, a substituted or unsubstituted amino group, and a substituted or unsubstituted C1 to C10 alkoxy group, and a, b, c, and d are each independently 0 or 1.

12. The resist underlayer composition of claim 1, wherein the compound is included in an amount of 0.01 wt % to 50 wt %, based on 100 wt % of the solvent.

13. The resist underlayer composition of claim 1, wherein the solvent includes at least one selected from propylene glycol monomethyl ether acetate (PGMEA), propylene glycol monomethylether (PGME), cyclohexanone, and ethyl lactate.

14. A method of forming patterns, comprising
providing a material layer on a substrate,
applying the resist underlayer composition according to claim 1 on the material layer,
heat-treating the resist underlayer composition to form a resist underlayer,
forming a photoresist layer on the resist underlayer,
exposing and developing the photoresist layer to form a photoresist pattern,
selectively removing the resist underlayer using the photoresist pattern to expose a part of the material layer, and
etching an exposed part of the material layer.

15. The method of claim 14, wherein forming the resist underlayer includes performing a spin-on-coating method.

16. The method of claim 14, wherein the resist underlayer composition is heat-treated at 150° C. to 500° C.

17. The method of claim 14, wherein before forming the resist underlayer, a bottom anti-reflective coating (BARC) is further formed.

18. The resist underlayer composition of claim 1, wherein the compound is represented by one of the following Chemical Formula A2, Chemical Formula B2,Chemical Formula C2, and Chemical Formula D2:

[Chemical Formula A2]

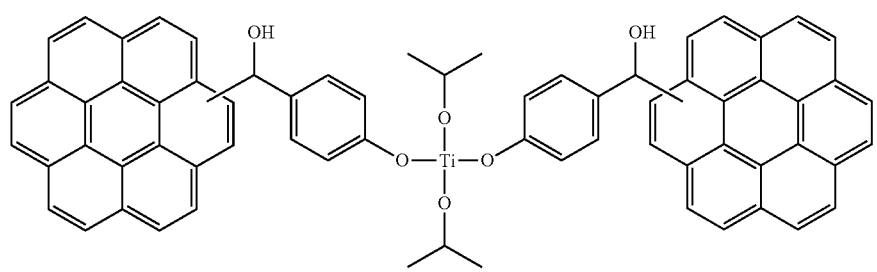

[Chemical Formula B2]

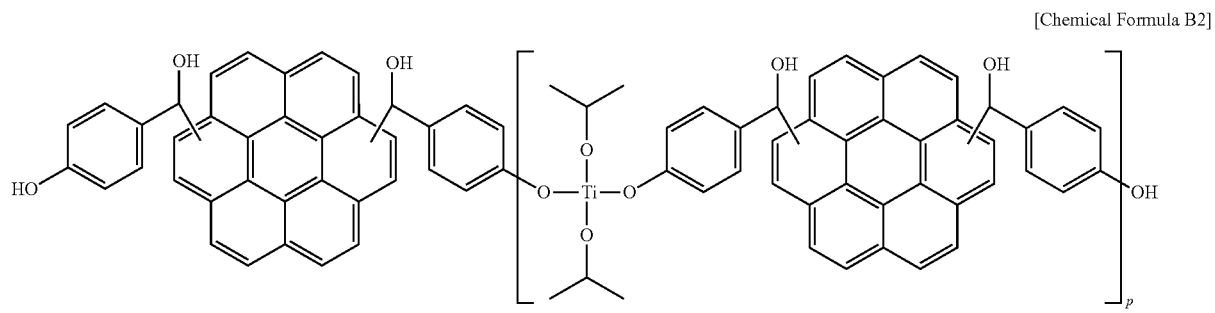

-continued
[Chemical Formula C2]
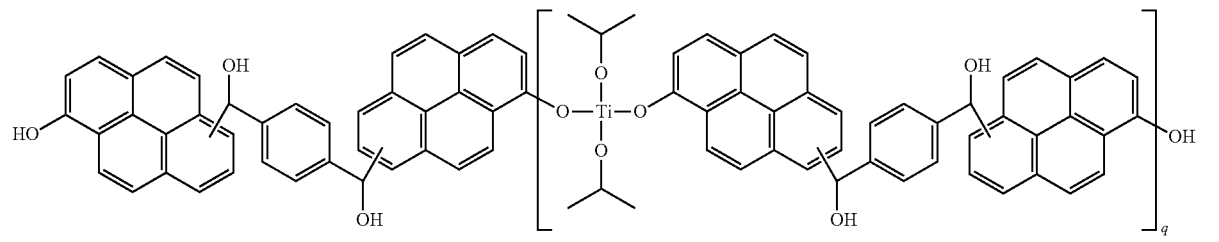
[Chemical Formula D2]
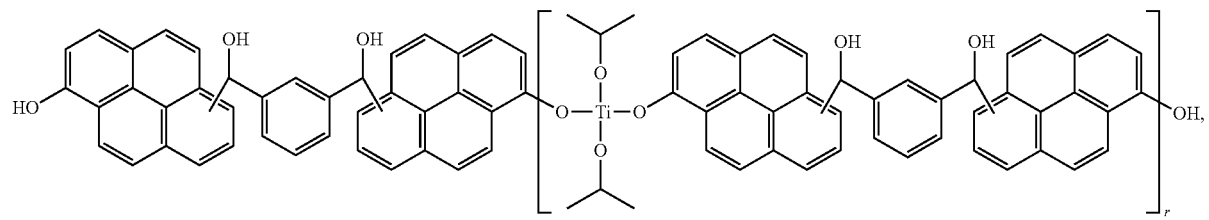
wherein, p, q, and r are each independently an integer of 1 to 15.
* * * * *